United States Patent
Kwon et al.

(10) Patent No.: US 6,238,970 B1
(45) Date of Patent: May 29, 2001

(54) METHOD FOR FABRICATING A DRAM CELL CAPACITOR INCLUDING ETCHING UPPER CONDUCTIVE LAYER WITH ETCHING BYPRODUCT FORMING AN ETCH BARRIER ON THE CONDUCTIVE PATTERN

(75) Inventors: O-Ik Kwon, Seoul; Se-Hyeong Lee, Kyunggi-do, both of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/343,353

(22) Filed: Jun. 30, 1999

(30) Foreign Application Priority Data

Jul. 2, 1998 (KR) .................................................. 98-26583

(51) Int. Cl.$^7$ .............................................. H01L 21/8242
(52) U.S. Cl. ......................... 438/254; 438/396; 438/397; 438/399
(58) Field of Search ................... 438/239, 254, 438/256, 396, 397, 399

(56) References Cited

U.S. PATENT DOCUMENTS

| | | | | |
|---|---|---|---|---|
| 5,960,293 | * | 9/1999 | Hong et al. | 438/397 |
| 6,013,549 | * | 1/2000 | Han et al. | 438/253 |
| 6,071,787 | * | 6/2000 | Joo | 438/369 |
| 6,097,055 | * | 8/2000 | Lee et al. | 257/309 |

* cited by examiner

Primary Examiner—Charles Bowers
Assistant Examiner—William M. Brewster
(74) Attorney, Agent, or Firm—Cantor Colburn LLP

(57) ABSTRACT

Provided is a method for fabricating a stacked capacitor with improved vertical and bottom etching profiles without electrical bridge between adjacent lower electrodes. Conductive layer for a lower electrode is deposited over an insulating layer whose top portion is made of a nitride etching barrier layer. During the etching of the conductive layer and subsequent overetching for lower electrode pattern, the nitride etching barrier layer serves an etching stopper and allows easier formation of polymer buildups on sidewalls of the lower electrode, more particularly on a bottom edge thereof. Resulting polymer buildups serve to prevent unacceptable bottom and sidewall etching of the lower electrode.

23 Claims, 2 Drawing Sheets

METHOD FOR FABRICATING A DRAM CELL CAPACITOR INCLUDING ETCHING UPPER CONDUCTIVE LAYER WITH ETCHING BYPRODUCT FORMING AN ETCH BARRIER ON THE CONDUCTIVE PATTERN

FIELD OF THE INVENTION

The present invention relates to a semiconductor manufacturing, and more particularly to a method for fabricating a stacked capacitor.

BACKGROUND OF THE INVENTION

Integrated circuit capacitors are widely used in integrated circuit devices. For example, in Dynamic Random Access Memory (DRAM) devices, integrated circuit capacitors may be used to store charge thereon and thereby store data. As the integration density of DRAM devices continues to increase, it is desirable to maintain sufficiently high storage capacitance while decreasing the area of an integrated circuit substrate that is occupied by each capacitor.

When the integration density of the integrated circuit capacitors is increased, it may become more difficult to align the capacitor lower electrode, also referred to as a storage node, to an underlying contact hole. Moreover, in order to allow relatively high capacitance while decreasing the substrate surface area of the capacitor, the height of the storage node may increase as the area decreases. For example the height of the storage node may increase to one micron or more in a stacked capacitor structure. This may result in a high aspect ratio of the storage node, for example an aspect ratio exceeding 5. This high aspect ratio may make it difficult to pattern a thick conductive layer to form the storage nodes.

A conventional process for stacked capacitor formation is described as follows. An insulating layer is formed over a semiconductor substrate. A contact is opened in the insulating layer to an active region of the semiconductor substrate and conductive material is deposited in the contact opening to form a contact plug. A thick conductive layer is deposited on the insulating layer including the contact plug. Anisotropic etching is carried to etch the thick conductive layer between each contact plug and thereby to form a stacked capacitor. Overetching is conventionally carried out after main etching of the thick conductive layer to obtain etching uniformity and avoid micro bridge between each storage node and the next.

Unfortunately, during anisotropic etching of the storage node, lateral etching may also occur, especially during the overetching process, which may cause the storage node to break. More specifically, as the etching process continues to expose the upper surface of the insulating layer, the exposed layer may be charged positively by etchant. As a result, etchant gas etches the bottom edges of the storage node to cause undercut phenomenon.

SUMMARY OF THE INVENTION

The present invention overcomes or alleviates the above-mentioned and other deficiencies of the prior art by providing a method for fabricating a DRAM cell capacitor which can prevent lateral etching of a capacitor electrode.

It is an object of the invention to provide a method for fabricating a DRAM cell capacitor which can reduce breakage of the capacitor lower electrode during fabrication thereof.

These and other objects are provided, according to the present invention, by forming an anti-reflection coating layer between an oxide layer (wherein a contact is opened) and a polysilicon layer for a storage node. The anti-reflection coating layer is made of material such as SiN or SiON which has relatively lower reflectivity as compared to an underlying oxide layer and also has an etch rate for a predetermined etchant that is intermediate between the insulating layer and the polysilicon layer. Accordingly, the anti-reflection coating layer can allow easier formation of polymer buildup on bottom edges of the lower electrode and thereby prevents lateral etching of the lower electrode at the bottom thereof.

More specifically, stacked lower electrodes are fabricated by forming an insulating layer including an oxide layer on the semiconductor substrate. An anti-reflection coating layer is deposited on the insulating layer. Contacts are opened in the anti-reflection coating layer and the insulating layer. A conductive layer such as polysilicon layer is deposited in the contact openings and on the anti-reflection coating layer to a thickness that determines the height of the lower electrodes. The conductive layer between each contact openings and the next is anisotropically etched to form the lower electrodes.

The anti-reflection coating layer comprises at least one of silicon nitride layer (SiN) and silicon oxynitride (SiON) layer. Anisotropic etching uses a mixture etchant containing hexafluoride ($SF_6$), chlorine ($Cl_2$) and nitrogen ($N_2$) gases. During etching, preferably overetching of the anti-reflection coating layer, a polymer is formed on the bottom edges of the lower electrodes adjacent to the anti-reflection coating layer. The polymer is formed by the reaction between etchant gases and the etched layer. For example, the polymer layer formed comprises $SiF_xN_y$. Resulting polymer buildup on bottom edges of the lower electrodes protects the bottom edge from etchant gases.

In one aspect of the present invention, contact plug may be formed in the contact opening. In other words, after forming the contact opening, a first conductive material fills the contact opening to form the contact plug. After that, a second conductive layer for the lower electrode is deposited over the anti-reflection coating layer including the contact plug. The second conductive layer is etched to form the lower electrode.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1:
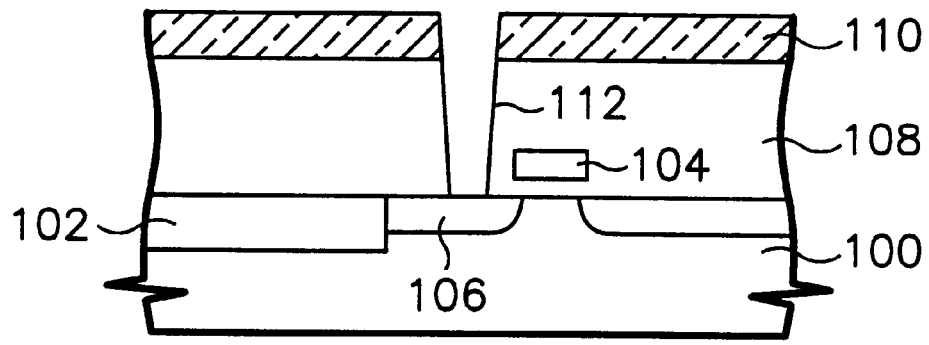
FIG. 1 is a cross-sectional view of a semiconductor substrate where a first insulating layer and a second insulating layer are formed and a contact is opened therein in accordance with the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, each embodiment described and illustrated herein includes its complementary conductivity type embodiment as well. For clarity, only one capacitor and one transistor are illustrated in drawings.

FIG. 1 schematically shows a cross-sectional view of a semiconductor substrate already undergone several processes in accordance with the present invention. A device isolation layer 102 is formed at a predetermined region of the semiconductor substrate 100 to define active and inactive regions therein. Though a plurality of transistors are formed in one process step, only one of them is shown in the drawings for clarity and better understanding of the current invention. For example, a transistor is formed on the active region. As is well known in the art, the transistor includes a gate electrode 104 coated with silicon nitride layer (i.e., hard mask and sidewall spacer) and a pair of source/drain regions 106 aligned laterally and within the substrate 100. The fabrication of the transistor is well known in the art and need not be described further herein.

Though not shown in the drawings, a contact pad can be further formed between the transistors to be electrically connected to the source/drain region in order to increase subsequent process window for contact hole formation. Briefly describing, after formation of the transistor, an insulating material is deposited to cover the transistor and a selected portion of the insulating material is etched to form an opening extending to the source/drain region. A conductive material is deposited in the opening and planarized to form the contact pad. Alternatively, instead of depositing the insulating material, the conductive material is deposited and then planarized to electrically separate each contact pad, thereby completing the contact pad.

A first insulating layer 108 such as an oxide layer is deposited on the semiconductor substrate 100 including the transistor. A second insulating layer 110 is deposited on the first insulating layer 108 to a thickness of about 200 Å to 600 Å. The second insulating layer 110 is made of a material such as SiN or SiON which has relatively lower reflectivity as compared to underlying first insulating layer 108 and also has an etch rate that is intermediate of the first insulating layer and later-formed second conductive layer for a lower electrode. Also, this second insulating layer 110 allows photo-etching process margins for contact hole formation. Namely, this second insulating layer 110 serves as an etching stopper. As described later, the second insulating layer 110 also allows easier formation of a polymer buildup during overetching the later-formed second conductive layer as for a storage node and thus protects the bottom edge of the etched-second conductive layer.

Figure 2:
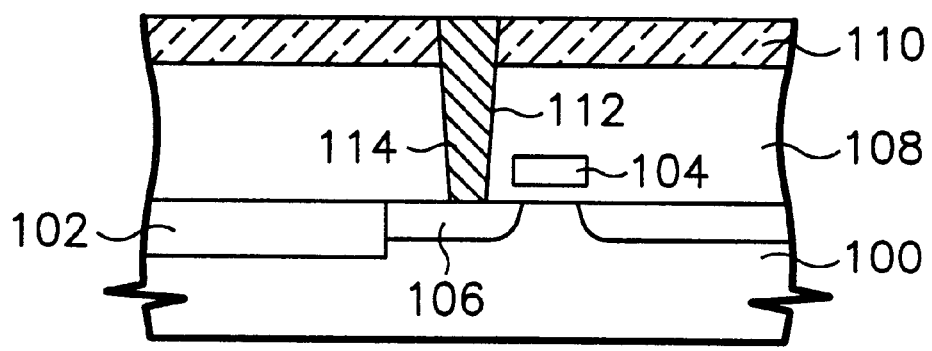
FIG. 2 illustrates a process step subsequent to that shown in FIG. 1 where a contact plug is formed in the contact opening.

Using a well-known photo-etching process, a contact hole 112 is opened in the second insulating layer 110 and in the first insulating layer 108 to one of source/drain regions 106 (or the contact pad in the case that the contact pad is formed). A first conductive layer is deposited in the contact opening and planarized to form a contact plug 114 as shown in FIG. 2. The planarization may be carried out by chemical mechanical polishing or etch back technique. The first conductive layer is made of a polysilicon.

Figure 3:
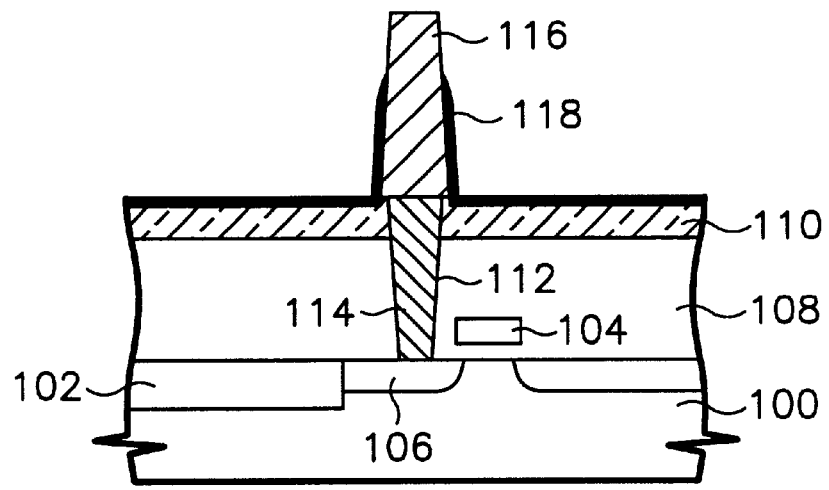
FIG. 3 illustrates a process step subsequent to that shown in FIG. 2 where intermediate lower electrode is formed while concurrently forming polymer buildups on sidewalls thereof.

A second conductive layer for a lower electrode is deposited on the resulting structure. The thickness of the second conductive layer is dependent on a desired capacitance. For example, polysilicon is deposited to a thickness of about 8,000 Å to 12,000 Å. Using photo-etching process, a selected part of the second insulating layer 110 is etched to form a lower electrode 116 as shown in FIG. 3 to be electrically connected to the contact plug 114.

The etching comprises anisotropic dry etching. More specifically, the dry etching uses a mixture of $Cl_2$ with about 20 to 50 sccm, $SF_6$ with 1 to 10 sccm and $N_2$ with 1 to 10 sccm, at a pressure of about 2 to 30 mtorr with a source power of about 400 to 800 W and bias power of about 30 to 100 W. After just etching the second conductive layer, overetching is generally performed to obtain etching uniformity and avoid micro bridge between each lower electrode 116 and the next. At this time, a partial thickness of the second insulating layer 110 is etched while concurrently forming polymers(etching byproducts) 118 such as $SiF_xN_Y$ on sidewalls of the lower electrodes 116. This polymer layer 118 protects the sidewalls of the lower electrode 116, more particularly, a bottom edge of the lower electrode 116, from being attacked by the etchant during the overetching process.

The photo-etching process for lower electrode 116 is as follows. A third insulating layer (not shown) for use as a mask is deposited on the second conductive layer. The third insulating layer is made of a silicon oxynitride layer. The third insulating layer has a relatively lower reflectivity as compared to the underlying second conductive layer. The third insulating layer is provided to minimize the CD(critical dimension) variation during photolithography process. A photoresist layer is then spin coated on the third insulating layer and patterned into desired configuration to define the lower electrode 116. Using patterned photoresist layer, the third insulating layer is etched to form mask pattern. Using the patterned photoresist layer and mask pattern, aforementioned anisotropic etching is carried out on the second conductive layer to form the lower electrode 116 structure shown in FIG. 3.

Figure 4:
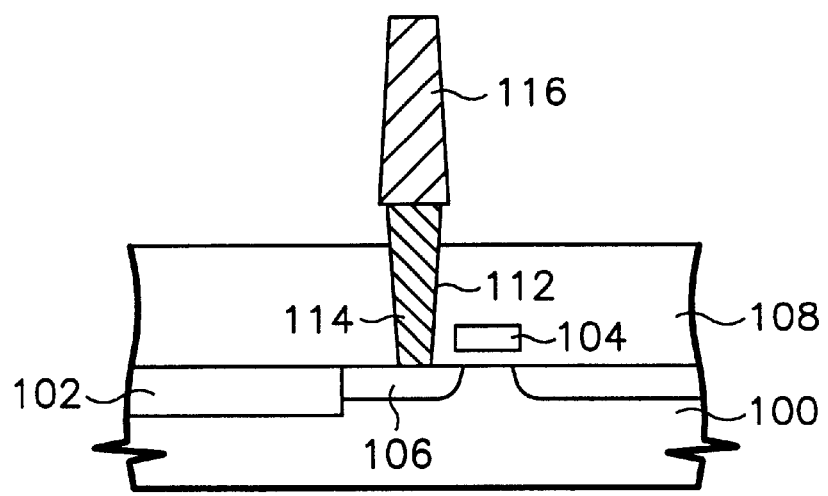
FIG. 4 illustrates a process step subsequent to that shown in FIG. 3 where lower electrode is completely formed with good vertical profile.

After removing the patterned photoresist layer by a conventional ashing and stripping method, the third insulating layer and the second insulating layer 110 are removed simultaneously until a top surface of the first insulating layer 108 is exposed. Removal of the third and second insulating layers is carried out by an etching process using $H_3PO_4$ solution at a temperature of about 100° C. to 200° C. for 1 minute to 10 minutes and then followed by a cleaning process using SC-1 solution at a temperature of about 50° C. to 100° C. for 1 minute to 10 minutes. During this etching and cleaning processes, the polymer 118 and the second insulating layer 110 are completely removed and to thereby form complete lower electrode 116 as shown in FIG. 4.

Subsequently a dielectric film and a third conductive layer as for an upper electrode are formed on the lower electrode 116 and the first insulating layer 108 to form a capacitor. The formation of the dielectric film and the upper electrode are conventional to one skilled in the art and their explanation is omitted.

According to another embodiment of the present invention, contact plug 114 and lower electrode 116 are formed simultaneously. After forming the contact opening 112, a conductive layer for lower electrode 116 is deposited in the contact opening 112 and on the second insulating layer 110 to a thickness that determines the height of the lower electrode 116 from a top surface of the second insulating layer 110. Using above-mentioned photo-etching process, the conductive layer is etched to form the lower electrode 116.

The subsequent processing steps of the second embodiment are identical to those previously described processing steps of the first embodiment. A dielectric film and a third conductive layer are sequentially deposited to form a capacitor.

The present invention provides a method for fabricating a stacked capacitor with improved vertical and bottom etching profiles without an electrical bridge between adjacent lower electrodes. According to one aspect of the present invention, during the just etching and over etching the polysilicon layer for formation of a lower electrode, a nitride layer serves as an etching stopper and also allows the easier formation of polymer buildup at the bottom edge of the lower electrode. The polymer buildups serve to protect the bottom edge of the lower electrode during over etching the electrode and thereby prevents necking phenomenon of the contact plug even in the case of misalignment between the lower electrode and the contact plug.

What is claimed is:

1. A method for fabricating a capacitor in a semiconductor device comprising:
    forming a lower insulating layer over a semiconductor substrate, said lower insulating layer having a top layer comprising nitrogen compound;
    etching selected portions of said lower insulating layer to form an opening to said semiconductor substrate;
    depositing an upper conductive layer in said opening and over said lower insulating layer; and
    etching said upper conductive layer to form a conductive pattern as for a lower electrode to be electrically connected to said semiconductor substrate through said opening,
    wherein said etching said upper conductive layer concurrently etches a partial thickness of said top layer and forms etching byproduct buildups on sidewall of said conductive pattern as an etching barrier layer.

2. The method according to claim 1, further comprising removing said top layer comprising nitrogen compound, forming a dielectric film and a conductive layer as for an upper electrode to form a capacitor.

3. The method according to claim 1, further comprising forming a second insulating layer on said upper conductive layer,
    wherein said etching said upper conductive layer to form a conductive pattern comprises etching said second insulating layer and said upper conductive layer, and removing a remainder of said second insulating layer concurrently with said top layer comprising nitrogen compound of said lower insulating layer.

4. The method according to claim 3, wherein removing said second insulating layer uses a phosphoric acid.

5. The method according to claim 1, wherein said semiconductor substrate further comprises a contact pad, a top portion of said contact pad being electrically connected to said conductive pattern.

6. The method according to claim 1, wherein said upper conductive layer comprises a polysilicon.

7. The method according to claim 1, wherein said top layer is made of a material selected from the group consisting of SiN and SiON.

8. The method according to claim 7, wherein said top layer is formed to a thickness in the range of about 200 Å and 600 Å.

9. The method according to claim 1, wherein said upper conductive layer is formed to a thickness in the range of about 8,000 Å and 12,000 Å.

10. The method according to claim 1, wherein etching said upper conductive layer comprises a dry etching.

11. The method according to claim 10, wherein said dry etching is carried out using a mixture of $Cl_2$ with a flow rate of about 20 to 50 sccm, $SF_6$ with a flow rate of 1 to 10 sccm and $N_2$ with a flow rate of about 1 to 10 sccm at a pressure of 2 to 30 mtorr with a source power of about 400 to 800 W and bias power of about 30 to 100 W.

12. A method for fabricating a capacitor in a semiconductor device comprising:
    forming a multilayer insulating layer over a semiconductor substrate having a transistor including a source/drain region and a gate electrode, said multilayer layer having a top insulating layer comprising nitrogen compound;
    etching said multilayer insulating layer to form a contact hole therein to said source/drain region;
    filling said contact hole with a first conductive layer to form a contact plug;
    depositing a second conductive layer on said multilayer insulating layer and on said contact plug;
    etching said second conductive layer to form a conductive pattern as for a lower electrode,
    wherein said etching said second conductive layer concurrently etches a partial thickness of said top insulating layer and forms etching byproduct buildups on sidewalls of said conductive pattern as an etching barrier layer.

13. The method according to claim 12, wherein said second conductive layer comprises a polysilicon.

14. The method according to claim 12, wherein said top insulating layer is made of a material selected from the group consisting of SiN and SiON.

15. The method according to claim 14, wherein said top insulating layer is formed to a thickness in the range of about 200 Å and 600 Å.

16. The method according to claim 12, wherein said second conductive layer is formed to a thickness in the range of about 8,000 Å and 12,000 Å.

17. The method according to claim 12, wherein said step of etching said second conductive layer comprises dry etching.

18. The method according to claim 17, wherein said dry etching is carried out using a mixture of $Cl_2$ with a flow rate of about 20 to 50 sccm, $SF_6$ with a flow rate of about 1 to 10 sccm and $N_2$ with a flow rate of about 1 to 10 sccm at about a pressure of 2 to 30 mtorr with a source power of about 400 to 800 W and bias power of about 30 to 100 W.

19. The method according claim 12, further comprising removing said top layer comprising nitrogen compound, forming a dielectric film and a conductive layer as for an upper electrode to form a capacitor.

20. The method according to claim 12, further comprising forming a second insulating layer on said upper conductive layer,
    wherein said etching said upper conductive layer comprises etching said second insulating layer to form a mask, using said mask and etching said upper conductive layer, and removing said mask concurrently with said top layer comprising nitrogen of said lower insulating layer.

21. The according to claim 12, wherein said semicondcutor substrate further comprises a contact pad, and said contact pad electrically connecting said conductive pattern and said source/drain region.

22. The method according to claim 12, wherein said filling said contact hole with a first conductive layer to form a contact plug comprises depositing a conductive material in said contact hole and on said multilayer insulating layer and planarizing said conductive material down to a top surface of said multilayer insulating layer.

23. The method according to claim 22, wherein said planarizing comprises a chemical mechanical polishing and an etch back.

* * * * *